(12) United States Patent
Dobson

(10) Patent No.: US 6,592,770 B1
(45) Date of Patent: Jul. 15, 2003

(54) METHOD OF TREATING AN ISULATING LAYER

(75) Inventor: Christopher David Dobson, Bristol (GB)

(73) Assignee: Trikon Holdings Limited, Gwent (GB)

(*) Notice: Subject to any disclaimer, the term of this patent is extended or adjusted under 35 U.S.C. 154(b) by 0 days.

(21) Appl. No.: 09/554,290

(22) PCT Filed: Feb. 24, 2000

(86) PCT No.: PCT/GB00/00651
§ 371 (c)(1),
(2), (4) Date: May 11, 2000

(87) PCT Pub. No.: WO00/51173
PCT Pub. Date: Aug. 31, 2000

(30) Foreign Application Priority Data

Feb. 26, 1999 (GB) .............................................. 9904427

(51) Int. Cl.[7] .................................................. B44C 1/22
(52) U.S. Cl. .......................... 216/44; 216/62; 216/63; 216/67; 216/76; 438/718; 438/725
(58) Field of Search ............................ 216/76, 67, 62, 216/63, 69, 44, 68, 81; 438/718, 725

(56) References Cited

U.S. PATENT DOCUMENTS

| 4,866,009 | A | | 9/1989 | Matsuda |
|---|---|---|---|---|
| 5,254,213 | A | | 10/1993 | Tamaki |
| 5,643,407 | A | | 7/1997 | Chang |
| 5,866,945 | A | | 2/1999 | Chen et al. |
| 5,935,334 | A | * | 8/1999 | Fong et al. ................. 118/723 |
| 5,958,798 | A | | 9/1999 | Shields |
| 6,153,537 | A | * | 11/2000 | Bacchetta et al. .......... 438/763 |
| 6,168,726 | B1 | * | 1/2001 | Li et al. ....................... 216/67 |

FOREIGN PATENT DOCUMENTS

| EP | 0 565 724 A1 | 10/1993 |
|---|---|---|
| GB | 1 498 329 | 1/1978 |
| GB | 2 329 069 | 3/1999 |
| JP | 10125782 | 5/1998 |
| WO | WO 92/11653 | 7/1992 |
| WO | WO 93/17453 | 9/1993 |

OTHER PUBLICATIONS

N. Oda et al., "0.6 um Pitch Highly Reliable Multilevel Interconnection Using Hydrogen Silicate Based Inorganic SOG for Sub–Quarter Micron CMOS Technology", 1997 Symposium on VLSI Technology Digest of Technical Papers, pp. 79 and 80.

* cited by examiner

Primary Examiner—Randy Gulakowski
Assistant Examiner—Gentale Winter
(74) Attorney, Agent, or Firm—Volentine Francos, PLLC

(57) ABSTRACT

This invention relates to a method of heating an insulating layer, such as is found in semiconductor devices, in which a formation has been etched through a layer of resist comprising reactive etching the resist, inhibiting absorption of or removing water vapor and/or oxygen at the exposed surfaces of the etched formation and filling the formation with conductive metal in the absence of said water vapor and/or oxygen.

17 Claims, 5 Drawing Sheets

METHOD OF TREATING AN ISULATING LAYER

CROSS-REFERENCE TO RELATED APPLICATIONS

This is a Continuation of International Application No. PCT/GB00/00651, filed Feb. 24, 2000.

This invention relates to a method of treating an insulating layer such as found in semiconductor devices.

As the designers of semiconductor architecture push the devices within the semiconductors closer and closer together, the permittivity of the insulating layers which are formed between the connecting metal tracks, becomes more significant. The trend is therefore to produce insulating materials with lower and lower dielectric constants (k) One approach to forming such materials is to introduce carbon into the insulating material and such a method is described in our co-pending International Patent Application PCT/GB97/02240, the disclosure of which is incorporated herein by reference.

In order to form the metal tracks separated by the insulating-layer or to connect those tracks to other tracks or devices formed in the semiconductor material on which the insulating layers are deposited, it is necessary to etch into or through the insulating layer and subsequently fill those recesses with electrically conducting metal. Such recesses are generally formed by coating the upper surface of the insulating layer with a photo-resist, removing certain parts of the resist using photo-lithographic techniques, etching through the exposed openings in the resist to form the recesses and then removing the layer of resist by reactively etching the resist using oxygen.

However, it has been found that where the insulating layer contains carbon, the dielectric constant increases as a result of the reactive oxygen etching, the side walls of the formation are etched creating barrelling and there are subsequent problems with filling the recesses with metal.

From one aspect the invention consists in a method of treating an insulating layer in which a formation has been etched through a layer of resist comprising reactive etching the resist (for example with a plasma process), inhibiting the absorption or removing water vapour and/or oxygen at carbon depleted sites of the exposed surfaces of the etch formation and filling the formation with conductive metal in the absence of said water vapour and/or oxygen.

The inhibiting step may include supplying hydrogen with or to an etchant gas, e.g. oxygen and/or it may comprise supplying nitrogen with or to the etchant gas. Preferably the step of inhibiting includes supplying a gas which is the source of reactive hydrogen and/or nitrogen with or to the etchant gas. In one embodiment the gas may be $NH_3$. Where the etchant gas is oxygen, the ratio of oxygen to the gas may be approximately 3:1 and similar ratio's may be appropriate with other etchant gases.

In an alternative arrangement the inhibiting step may be performed by maintaining the substrate under vacuum until the metallisation step is completed or there may be a removal step including heating the insulating layer prior to metallisation to outgas the insulating material.

Preferably the insulating layer has a dielectric constant of less than 4 and/or includes carbon. More particularly the dielectric constant is below 3.5 and most preferably below 3.0.

The carbon concentration in the dielectric film is most preferably more than 10%.

Although the invention has been defined above it is to be understood it includes any inventive combination of the steps set out above or in the following description.

The invention may be performed in various ways and specific examples will now be described, by way example, with reference to the accompanying drawings, in which.

Figure 1:
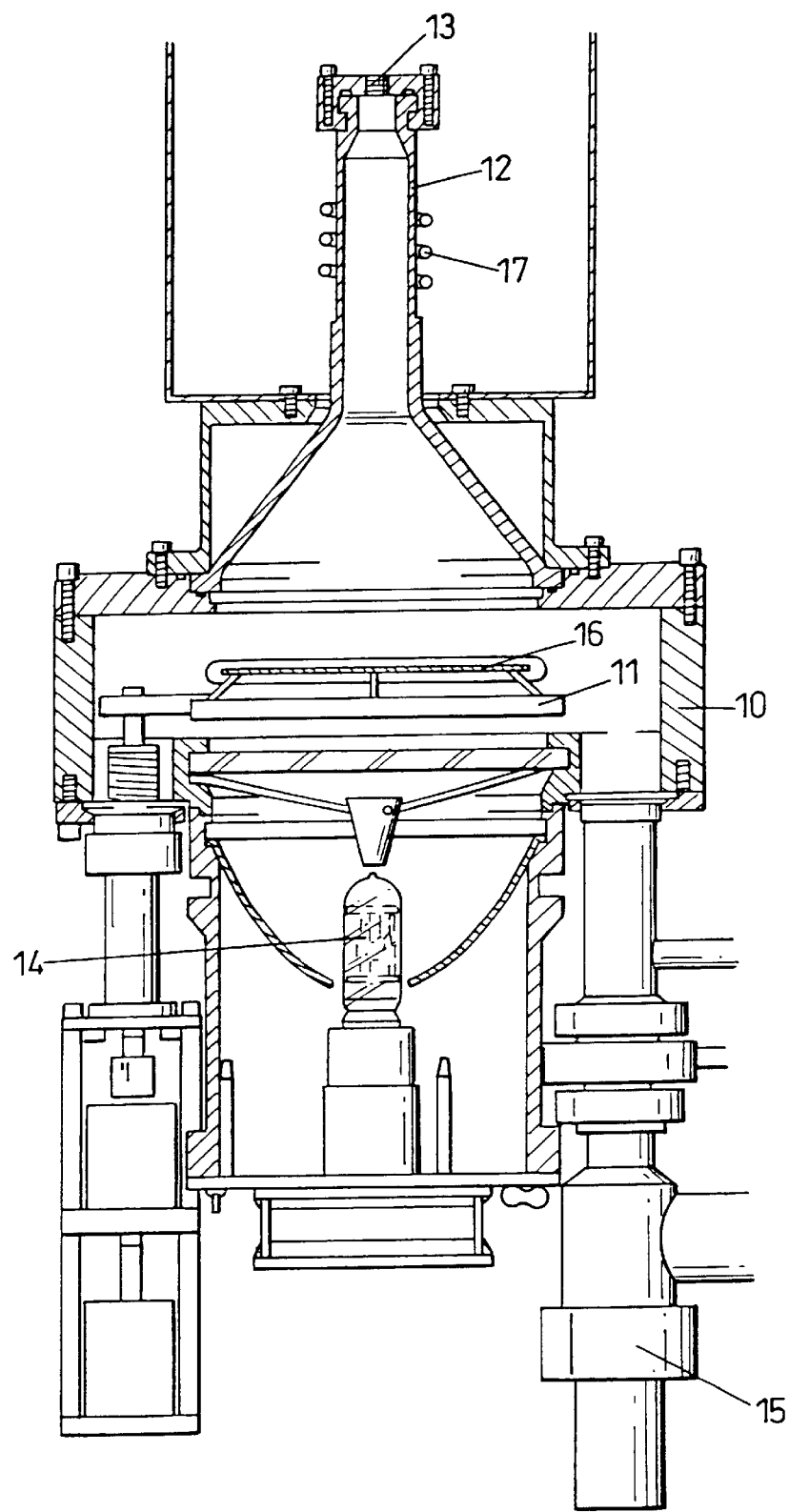
FIG. 1 is a vertical section or view through apparatus for performing the method.
Figure 2:
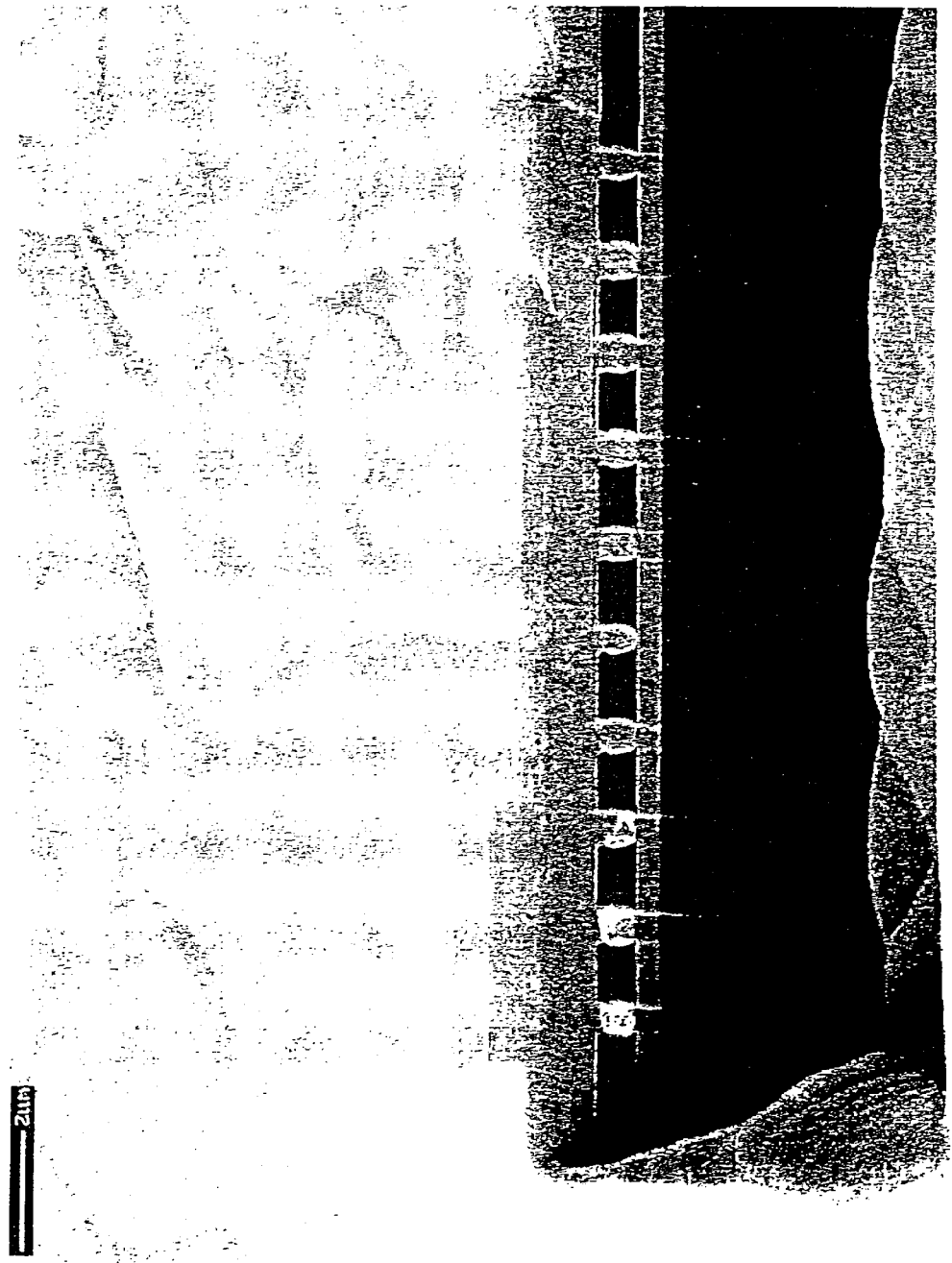
FIG. 2 is a view of an insulating layer with a number of vias filled using prior art techniques.
Figure 3:
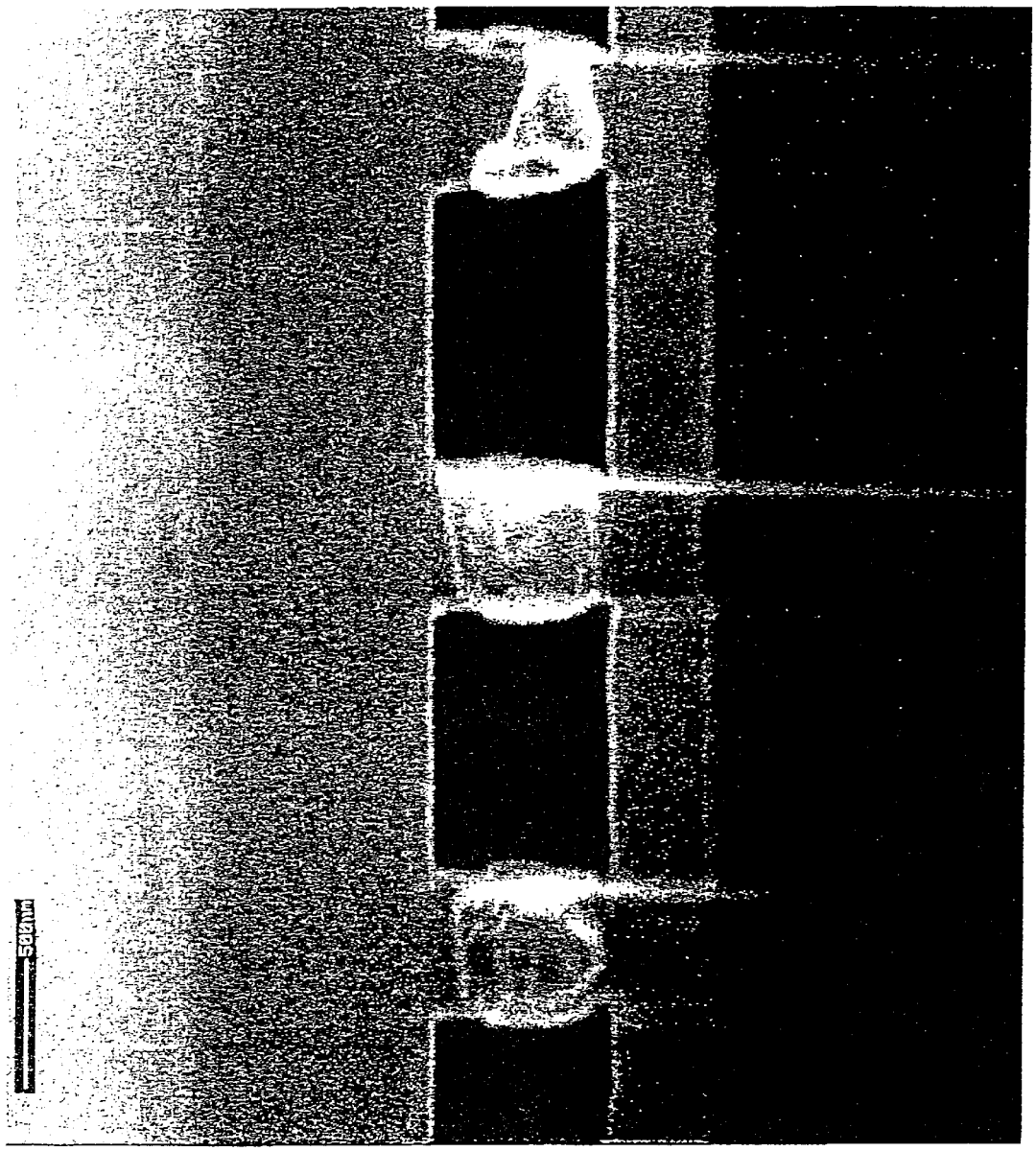
FIG. 3 is an enlargement of the vias of FIG. 3.
Figure 4:
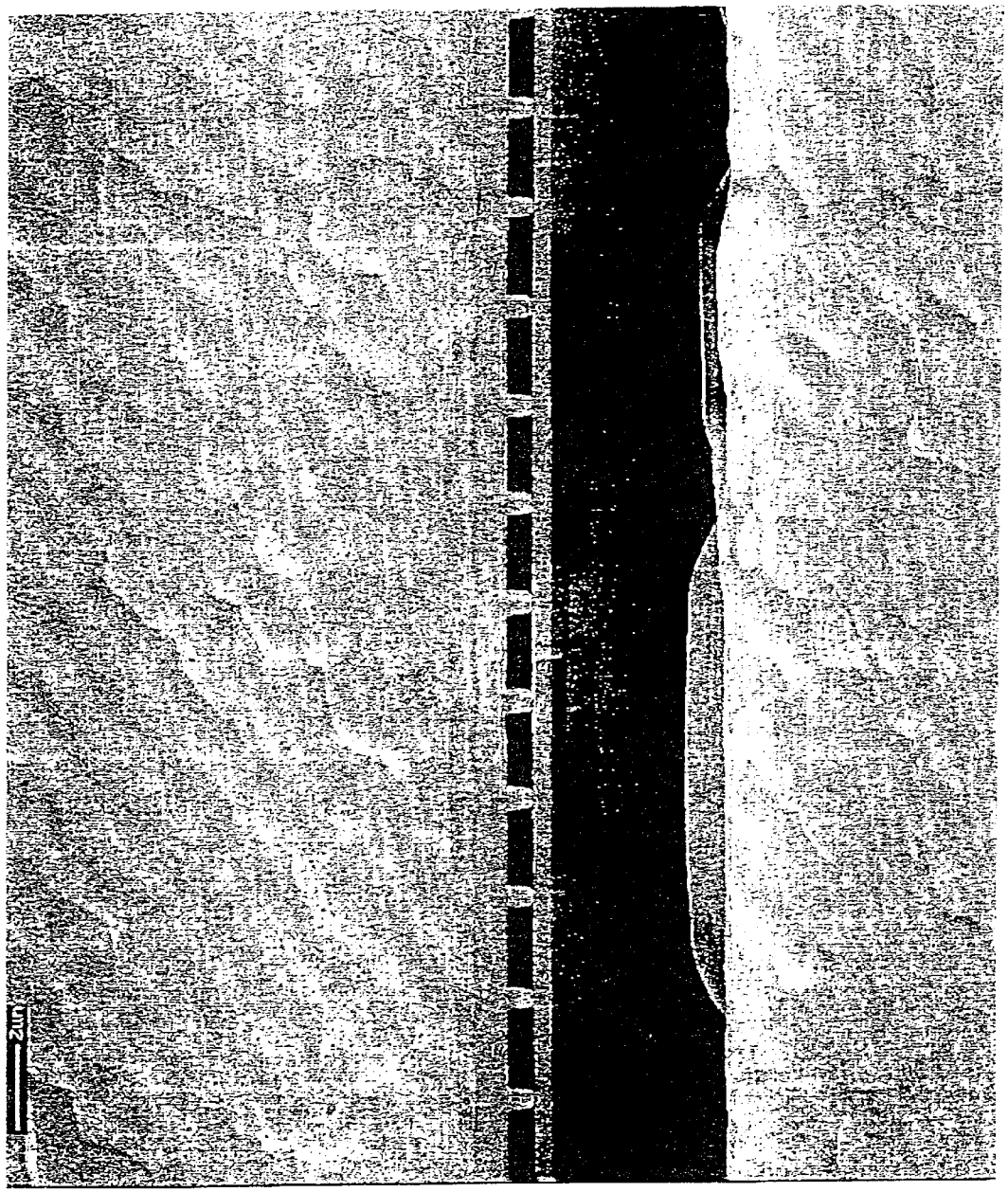
FIG. 4 is a view of vias filled utilising the steps of the present invention.
Figure 5:
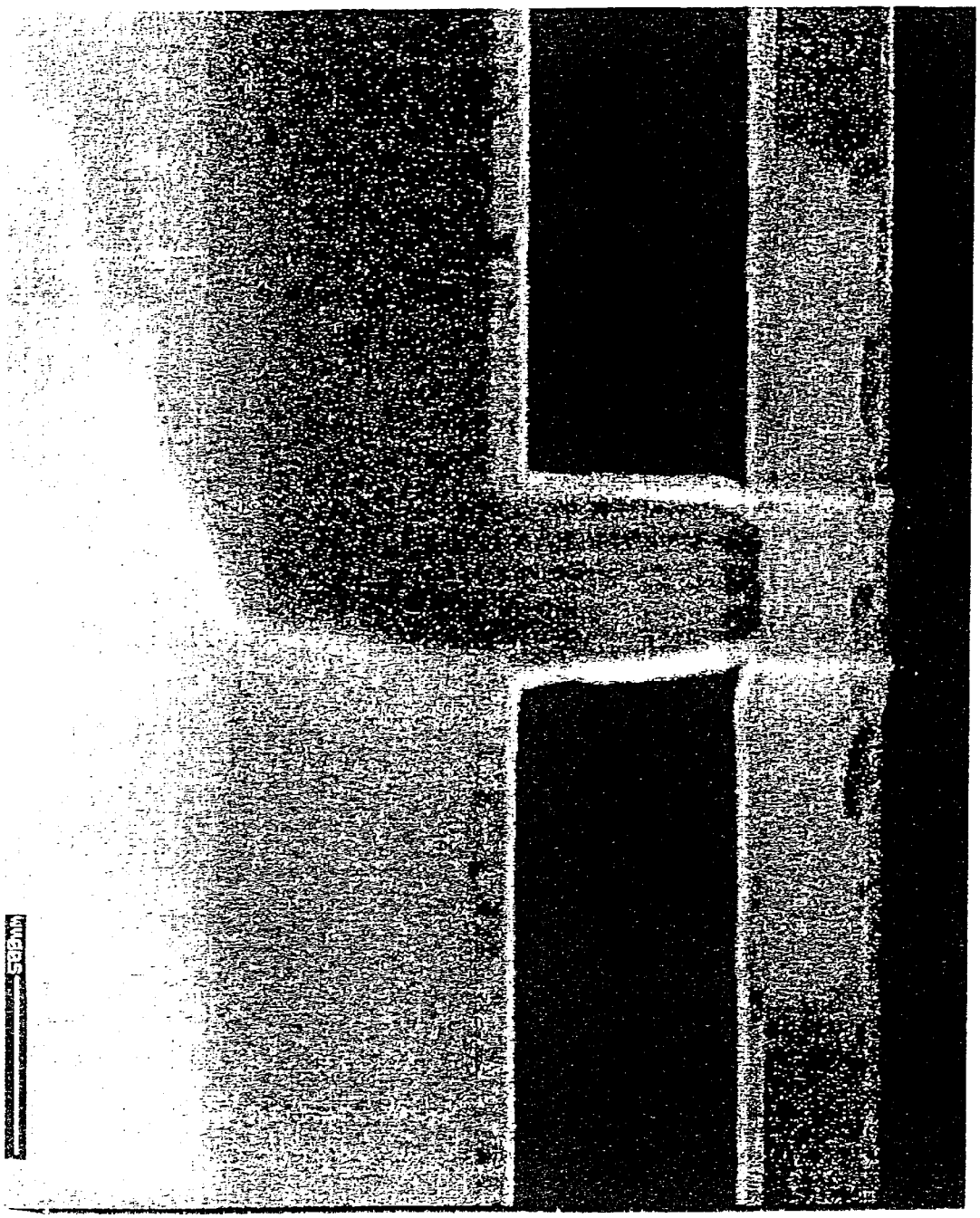
FIG. 5 is an enlargement of a single via.

Referring to FIG. 1 a vacuum chamber 10 includes a wafer support 11 for supporting a wafer opposite a plasma source 12 through which reactive gas can be streamed via gas inlet 13. A heating lamp 14 is provided for heating the wafer 16 and the chamber can be evacuated via a high vacuum valve 15. A plasma is generated remotely from the wafer in the plasma tube by means of an RF coil 17.

To etch the dielectric layer, a wafer 16 is placed upon the support 11 and, in the prior art arrangement, oxygen is streamed into the chamber through the plasma tube 12 and reactively etches the photo-resist on the wafer 16, as has previously been described.

The following experiment was performed:

In order to remove photo-resist and strip back anti-reflective coating materials the above described process was run initially using oxygen only and then using a gas mixture including $NH_3$.

The following conditions applied:

| 150 mm wafer using 1 kw lamp | | |
|---|---|---|
| | Step 1 | Step 2 |
| Oxygen only process (conventional resist strip) | | |
| Gas Flow: | 496 sccm $O_2$ | 496 sccm $O_2$ |
| Pressure: | 750 mT | 750 mT |
| Plasma power: | 500 W ICP | 500 W ICP |
| Lamp heater: | 80% lamp power | 45% lamp power |
| Process time: | 60 sec's | 120 sec's |
| Ammonia containing process (embodiment of the invention) | | |
| Gas Flows: | 496 sccm $O_2$ | 496 sccm $O_2$ |
| | 50 sccm $N_2$ | 50 sccm $N_2$ |
| | 150 sccm $NH_3$ | 150 sccm $NH_3$ |
| Pressure: | 750 mT | 750 mT |
| Plasma power: | 500 W ICP | 500 W ICP |
| Lamp heater: | 80% | 45% |
| Process time: | 40 sec's | 90 sec's |

[ICP: Inductively Coupled Plasma]

Actual temperatures of the substrate was not measured but estimated at ~250° C.

Subsequently to metallise the via holes with barrier/contact layers and aluminium the following process was run:

| Preheat: 1.5 kW, 5 mins | | |
|---|---|---|
| Barrier deposition: | Ti/TiN | 300 A/700 A deposited at 200° C. |
| Aluminium alloy deposition: | Al/0.5% Cu | 1 micron deposited at 450° C. |
| Forcefill ® : | 440° C., 1 min | 1200 bar inlet pressure 720 bar chamber pressure |

(Forcefill is the Trade Mark for a metallisation process described in our European Application Patent No. 92304633.8 and U.S. Pat. No. 5,527,861, which are incorporated by reference)

Using the above metallisation process 100% of via holes were filled with the ammonia resist strip process and 70% of via holes were filled with the oxygen only resist strip process. It is also known that a commercial tungsten plug preceded by barrier/contact layers also suffered from unreliable via hole filling when the dielectric contained carbon and a conventional resist strip process was carried out without the further processing according to this invention.

FIGS. 2 and 3 and 4 and 5 are SEM's of the oxygen only and the gas mixture processes respectively. In these SEM's the bright areas represent voids and it will be seen that the conventional metallisation process is rather unsuccessful. In contrast the gas mixture approach provides good metallisation.

It is not fully understood why the standard oxygen plasma resist strip process creates metallisation problems nor why the introduction of ammonia resolves them. However it is a problem widely known by those attempting to integrate low k dielectric materials, particularly within C>10% containing dielectrics. It is possible that carbon is removed during the oxygen reactive etching leaving the exposed surface of the formation vulnerable to attack and contamination e.g. by water vapour being absorbed during subsequent atmospheric exposure. Such exposure generally takes place, because photo-resist removing stations and metallisation stations are manufactured as independent units. However, if this analysis is correct, it is conceivable that the benefits seen above could also be obtained either by significant heating, for example under vacuum, to outgas the insulating layer prior to metallisation or by maintaining the wafer in vacuum between the resist stripping process and the completion of the metallisation process. The pre-heating option is not commercially desirable both for thermal budget reasons and because it will slow throughput.

It is hypothesed that the introduction of ammonia into the oxygen may overcome the problems of the oxygen only process because the hydrogen from the ammonia replaces the carbon removed by the oxygen by attaching to the dangling silicon bonds. This substitution of the hydrogen for the removed carbon thus stabilises the dielectric structure and guards against subsequent water vapour and absorption. Additionally or alternatively the nitrogen may replace the carbon or there may be an as yet unidentified interaction of the hydrogen and nitrogen in a carbon replacement process.

Additionally or alternatively the presence of hydrogen and/or nitrogen may inhibit the actual replacement of carbon by oxygen.

It is possible that the nitrogen/hydrogen treatment step may be carried out separately prior to the metallisation step, although once again this is probably a less attractive solution for reasons of throughput.

What is claimed is:

1. A method of treating an organic insulating layer containing carbon in which a formation has been etched through a layer of resist, said method comprising:

reactive etching the resist by supplying a reactive etchant gas to a chamber containing the organic insulating layer;

inhibiting the absorption of or removing water vapour and/or oxygen at carbon depleted sites of the exposed surfaces of the etched formation of the organic insulating layer by supplying hydrogen in the chamber with the reactive etchant gas; and filling the etched formation with conductive metal after inhibiting the absorption of or removing water vapour and/or oxygen at the carbon depleted sites of the exposed surfaces of the etched formation;

wherein the organic insulating layer containing carbon is an insulating layer having more than 10% carbon.

2. A method as claimed in claim 1, wherein the hydrogen is mixed with the reactive etchant gas.

3. A method as claimed in claim 1, wherein the hydrogen is supplied separately from the reactive etchant gas.

4. A method as claimed in claim 1, wherein said inhibiting includes supplying a gas which is a source of reactive hydrogen with the reactive etchant gas.

5. A method as claimed in claim 4, wherein the gas is $NH_3$.

6. A method as claimed in claim 4, wherein the reactive etchant gas includes oxygen, and wherein a ratio of oxygen to the gas is approximately 3:1.

7. A method as claimed in claim 1, further comprising maintaining the insulating layer under vacuum until the etched formation is filled with the conductive material.

8. A method as claimed in claim 1, further comprising heating the insulating layer prior to filling the etched formation with the conductive material.

9. A method as claimed in claim 1, wherein the insulating layer has a dielectric constant of less than 4.

10. A method as claimed in claim 1, further comprising heating the insulating layer prior to filling the etched formation with the conductive material.

11. A method of treating an organic insulating layer containing carbon in which a formation has been etched through a layer of resist, said method comprising:

reactive etching the resist by supplying a reactive etchant gas to a chamber containing the organic insulating layer;

inhibiting the absorption of or removing water vapour and/or oxygen at carbon depleted sites of the exposed surfaces of the etched formation of the organic insulating layer by supplying nitrogen in the chamber with the reactive etchant gas; and filling the etched formation with conductive metal after inhibiting the absorption of or removing water vapour and/or oxygen at the carbon depleted sites of the exposed surfaces of the etched formation;

wherein the organic insulating layer containing carbon is an insulating layer having more than 10% carbon.

12. A method as claimed in claim 11, wherein the nitrogen is mixed with the reactive etchant gas.

13. A method as claimed in claim 11, wherein the nitrogen is supplied separately from the reactive etchant gas.

14. A method as claimed in claim 11, wherein said inhibiting includes supplying a gas which is a source of reactive nitrogen with the reactive etchant gas.

15. A method as claimed in claim 14, wherein the reactive etchant gas includes oxygen, and wherein a ratio of oxygen to the gas is approximately 3:1.

16. A method as claimed in claim 11, further comprising maintaining the insulating layer under vacuum until the etched formation is filled with the conductive material.

17. A method as claimed in claim 11, wherein the insulating layer has a dielectric constant of less than 4.

* * * * *